United States Patent
Alley et al.

(10) Patent No.: US 7,784,002 B2
(45) Date of Patent: Aug. 24, 2010

(54) SYSTEMS FOR USING RELATIVE POSITIONING IN STRUCTURES WITH DYNAMIC RANGES

(75) Inventors: Charles L. Alley, Durham, NC (US);
Robert B. Likovich, Raleigh, NC (US);
Joseph D. Mendenhall, Cary, NC (US);
Chad E. Winemiller, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 12/253,481

(22) Filed: Oct. 17, 2008

(65) Prior Publication Data
US 2009/0089728 A1      Apr. 2, 2009

Related U.S. Application Data

(62) Division of application No. 11/279,237, filed on Apr. 10, 2006, now Pat. No. 7,461,364.

(51) Int. Cl.
*G06F 17/50* (2006.01)
(52) U.S. Cl. .......................................... 716/5
(58) Field of Classification Search ................ 716/5
See application file for complete search history.

(56) References Cited

U.S. PATENT DOCUMENTS

| | | | |
|---|---|---|---|
| 4,965,723 A | 10/1990 | Kirk et al. | |
| 5,214,647 A | 5/1993 | Komatsu | |
| 5,793,991 A | 8/1998 | Mangione-Smith | |
| 5,844,826 A | 12/1998 | Nguyen | |
| 5,857,084 A | 1/1999 | Klein | |
| 6,154,048 A | 11/2000 | Iwanczuk et al. | |
| 6,301,631 B1 | 10/2001 | Chambers et al. | |
| 6,633,607 B1 | 10/2003 | Akamatsu et al. | |
| 6,948,145 B2 | 9/2005 | Brown, III et al. | |
| 7,461,364 B2 * | 12/2008 | Alley et al. ................ | 716/5 |
| 2008/0216026 A1 * | 9/2008 | Gotou ......................... | 716/2 |

\* cited by examiner

*Primary Examiner*—Jack Chiang
*Assistant Examiner*—Brandon W Bowers
(74) *Attorney, Agent, or Firm*—Mark E. McBurney; Schubert Law Group PLLC (57) ABSTRACT

Systems for using relative positioning of items or components in a structure with dynamic ranges, such as an elastic I/O bus design for an Integrated Circuit (IC), are disclosed. Embodiments may include a user-defined type module having user-defined types representing relative instance positions within a structure. Embodiments may also include a translation helper module to receive information associated with a hierarchy and to return location information associated with the hierarchy and a translation module to translate between a specific location and a relative position of the instance based on one or more user-defined types and location information returned from the translation helper module to generate a list of translated results. Further embodiments of the translation module may include a relative position determiner to translate specific locations to relative positions and may also include a specific location determiner to translate relative positions to specific locations.

5 Claims, 4 Drawing Sheets

SYSTEMS FOR USING RELATIVE POSITIONING IN STRUCTURES WITH DYNAMIC RANGES

CROSS-REFERENCES TO RELATED APPLICATION(S)

Pursuant to 35 USC §121, this divisional application claims priority to and benefit of U.S. patent application Ser. No. 11/279,237, entitled "SYSTEMS, METHODS, AND MEDIA FOR USING RELATIVE POSITIONING IN STRUCTURES WITH DYNAMIC RANGES", filed on Apr. 10, 2006, the disclosures of which are incorporated herein in its entirety for all purposes.

BACKGROUND OF THE INVENTION

The present invention generally relates to the field of functional simulation and verification of complex systems. More particularly, the present invention relates to systems for using relative positioning in structures with dynamic ranges, such as for verification of Input/Output (I/O) bus designs as part of an Integrated Circuit (IC) design.

When designing increasingly complex processors or IC chips such as Application-Specific ICs (ASICs) and system-on-chips (SoC's), functional verification has proven to be a major bottleneck in achieving time-to-market goals. Many companies now realize that functional verification of complex chips has become an inefficient, unwieldy, and incomplete process. Design teams report that functional verification of medium- to large-complexity processors, ASICs or SOC's may consume over 70% of the project's manpower, schedule and budget. In spite of the time and resources consumed by functional verification, it is still often incomplete, allowing design bugs to go undetected. Improved functional verification can cut costs, improve design quality and accelerate time-to-market, as well as allowing companies to sharply increase the productivity of precious verification personnel.

The design process for a chip starts with the creation of a functional specification for the design. Once the functional specification has been completed, the verification team typically creates a test plan that specifies the design features and functions to be tested at both the block and system levels. The verification team then creates tests such as deterministic tests and weighted-random tests to verify design functionality until all test plan requirements have been met. The verification process involves developing and simulating tests that are used to determine whether design components (e.g., processor units, I/O busses, resources, functions, etc.) behave according to their functional specification in a process known as functional verification. Functional verification is often an iterative process where the entire system (or at least all its major features) is tested on a continuous basis for the duration of the design process. Functional verification is typically completed before fabrication, as finding and fixing errors, or bugs, after fabrication proves to be time-consuming and expensive. Functional coverage is the study and analysis of the quality and completeness of functional verification. It includes statistical, stochastic and heuristic analysis of functional verification progress and completeness.

Software tools have been developed to help designers and testers with the functional verification process. A design under test (DUT) may be described using a hardware description language (HDL) such as VHSIC (Very High Speed Integrated Circuits) HDL (VHDL) or Verilog. Automation tools such as Verisity Design, Inc.'s (Verisity) (owned by Cadence Design Systems, Inc.) Specman® testbench automation software provide an environment for generation of functional tests, data and temporal checking, functional coverage analysis, and HDL simulation control.

Some design components require sophisticated modeling in order to properly simulate their performance (and thus to complete functional verification). Functional verification of a parameterizable, high-speed, self-aligning, elastic I/O design, for example, poses problems with existing verification environments. Special conditions often occur in the DUT when simulating error scenarios and distortions on certain bits of a bus which fall on the boundaries of logical or physical hierarchical layers (such as 'bus', 'group', and 'pack' layers) in the design. Other unique scenarios can also occur when, for example, every bit in a group or pack has been affected by self-healing, errors, or various distortions. Since these boundaries can change due to the parameterizable nature of the design, to properly verify a design with these special conditions a mechanism is needed to indicate whether the functional simulation has provided for these conditions to occur on all of the important boundaries and on entire hierarchical layers of interest. Existing verification languages, however, are limited in that they do not permit coverage items using variable ranges, restricting their use for designs with sizes and boundaries of the bus hierarchies that are parameterizable and thus not constants (such as elastic I/O designs).

One solution to this problem would be to create preprocessor "#define" constants for each bus configuration and to use those constants in the coverage items ranges. While this solution would be effective in many situations, it would be tedious, labor-intensive, and subject to error. In this solution, new configuration files would need to be generated to define the specific sizes and boundaries for each group and pack in the bus, for example, and these files would need to be separately maintained, archived, and associated with their specific VHDL configurations. This method would therefore consume extra space, create file clutter, and be difficult and time-consuming to manage. There is, therefore, a need for an improved mechanism for functional simulation and verification of parameterizable components such as I/O bus designs, particularly for verifying error scenarios or specific test patterns on logical and physical hierarchy layer boundaries or on entire hierarchical layers.

BRIEF SUMMARY OF THE INVENTION

The problems identified above are in large part addressed by systems, methods, and media for using relative positioning of items or components in a structure with dynamic ranges, such as an elastic I/O bus design for an Integrated Circuit (IC). More particularly, a system for using relative entity positioning within a structure such as an IC design is disclosed. The system may include a user-defined type module having user-defined types representing relative instance positions within a structure. Embodiments may also include a translation helper module to receive information associated with a hierarchy and to return location information associated with the hierarchy and a translation module to translate between a specific location and a relative position of the instance based on one or more user-defined types and location information returned from the translation helper module to generate a list of translated results, such as bit, bus, or chip locations. Further embodiments may include a relative position determiner to translate specific locations to relative positions and may also include a specific location determiner to translate relative positions to specific locations.

BRIEF DESCRIPTION OF THE SEVERAL VIEWS OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

DETAILED DESCRIPTION OF THE INVENTION

The following is a detailed description of example embodiments of the invention depicted in the accompanying drawings. The example embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Systems, methods, and media for analyzing relative positioning of a structure with dynamic ranges, such as an elastic I/O bus design of an Integrated Circuit (IC), are disclosed. More particularly, a system including a user-defined type module having user-defined types representing relative instance positions within a structure is disclosed. Embodiments may also include a translation helper module to receive information associated with a hierarchy and to return specific location information associated with the hierarchy and a translation module to translate between a specific location and a relative position of the instance based on one or more user-defined types and specific location information returned from the translation helper module to generate a list of translated results, such as bit, bus, or chip locations. Further embodiments may include a relative position determiner to translate specific locations to relative positions and may also include a specific location determiner to translate relative positions to specific locations. A structure may include a representation of any type of system or design, including but not limited to an IC design, a design of an IC component such as an elastic I/O bus, or a component of a testbench or verification environment.

The disclosed system provides an effective and efficient mechanism for analyzing relative positioning in a structure such as an IC design. A verification engineer or other user may utilize the disclosed system to translate relative positions to specific locations in the design, or vice versa. The verification engineer could, for example, efficiently determine whether a particular group of bits that were hit during testing corresponded to boundaries of a bus design or entire logical groups or physical packs of a bus, locations that often cause difficulties during verification. This may be advantageously accomplished without the verification engineer having to know details of the bus design, reducing the time and effort involved. Similarly, a user seeking to generate tests may use the disclosed system to efficiently determine which bits of a structure correspond to boundary conditions or other special types, allowing the user to craft tests designed to satisfy those conditions. The disclosed system may also be expanded to multi-chip IC designs in addition to multi-bit bus designs, providing a flexible mechanism for enhancing coverage and generation abilities.

While specific embodiments will be described below with reference to particular configurations of hardware and/or software, those of skill in the art will realize that embodiments of the present invention may advantageously be implemented with other substantially equivalent hardware and/or software systems. Aspects of the invention described herein may be stored or distributed on computer-readable media, including magnetic and optically readable and removable computer disks, as well as distributed electronically over the Internet or over other networks, including wireless networks. Data structures and transmission of data (including wireless transmission) particular to aspects of the invention are also encompassed within the scope of the invention.

Figure 1:
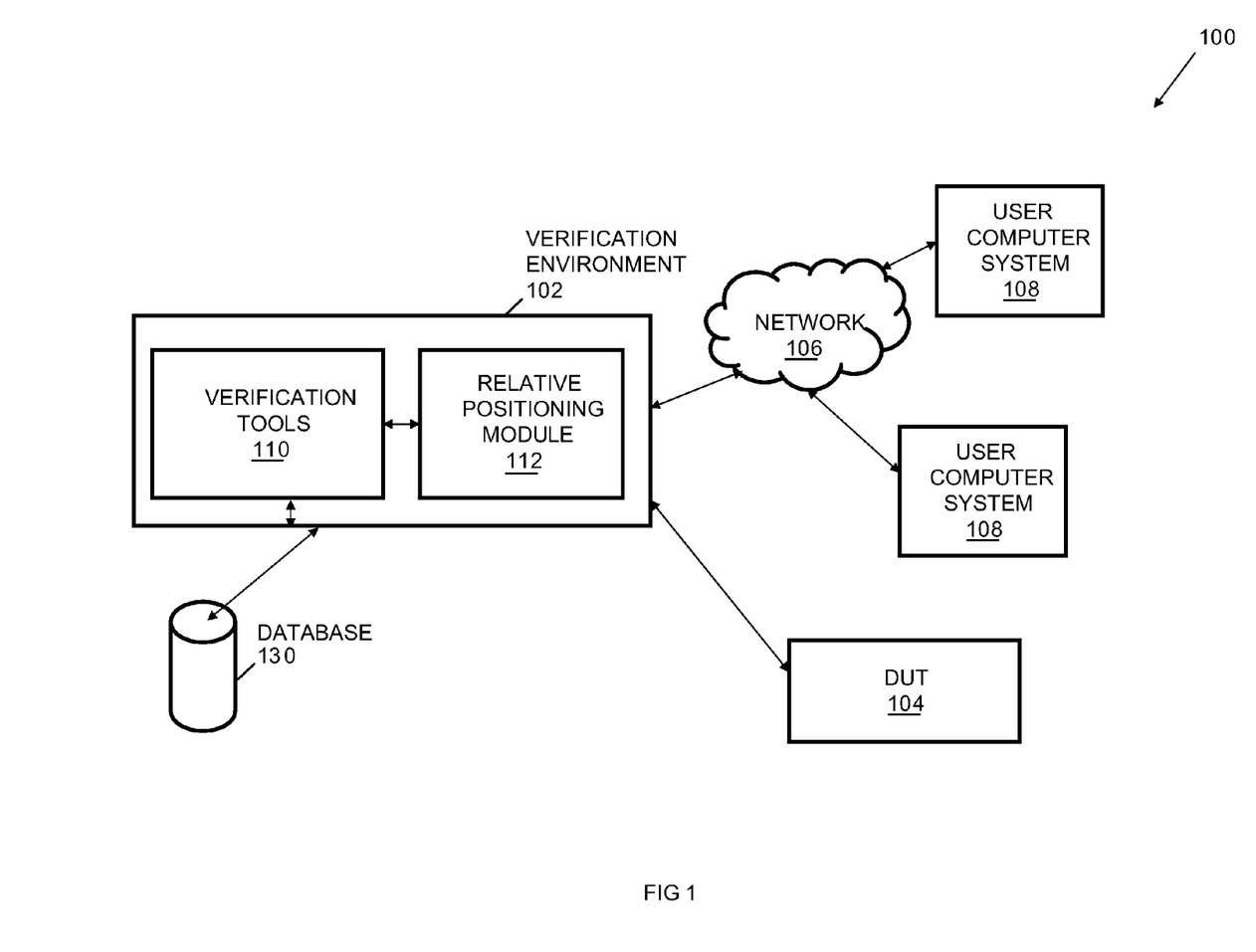
FIG. 1 depicts an environment for a system for performing functional verification of a design and utilizing a relative position module according to some embodiments.

Turning now to the drawings, FIG. 1 depicts an environment for a system for performing functional verification of a design and utilizing a relative position module according to some embodiments. Functional verification system 100 may include a verification environment 102 in communication with a design under test (DUT) 104, which may represent an I/O bus design or other design. The verification environment 102 may serve as a stimulus mechanism and may drive various kinds of clock and data patterns onto the DUT 104 in a controllable fashion. By doing so, the verification environment 102 may activate various states of the DUT 104 to simulate and eventually verify its performance and design. The verification environment 102 and the DUT 104 may, in one embodiment, be software and/or state machines implemented on one or more of any type of computer system, including servers, personal computers, workstations, mainframe computers, notebook or laptop computers, desktop computers, or the like. In one example, the verification environment 102 may be implemented on an International Business Machines, Inc. (IBM) IBM® eServer or similar server having one or more processors, or threads of processors, executing software and/or one or more state machines coupled with data storage devices such as random access memory (RAM), read only memory (ROM), flash memory, compact disk drives, hard drives, and the like.

The verification environment 102 may be in communication with one or more user computer systems 108 via network 106. Designs, tests, administrators, or other users may utilize a user computer system 108 to access the verification tools 110 and/or relative position module 112 of the verification environment. User computer systems 108 may be servers, personal computers, workstations, mainframe computers, notebook or laptop computers, desktop computers, mobile computers, hand-held devices, or any other type of computer system. Network 106 may be any type or combination of data communications channels, such as the Internet, an intranet, a LAN, a WAN, an Ethernet network, a wireless network, a proprietary network, a broadband cable network, or combination thereof. The verification environment 102 may also be in communication with (or alternatively include) a database 130 for storage of design files, testcases, user-defined types, user preferences, or other information.

The DUT 104 may represent a parameterizable design (i.e., a structure) such as an I/O bus whose design is being functionally simulated and verified by the verification environment 102. The DUT 104 may be described using a hardware description language (HDL) such as VHDL or Verilog. The DUT 104 may, in some embodiments, include a TX unit and an RX unit representing the transmission and receiving functions, respectively, of an I/O bus. During verification, the verification environment 102 may drive the TX unit and/or the RX unit of the DUT 104 to simulate various test conditions. In one embodiment, the DUT 104 may represent a high-speed, self-aligning, elastic I/O design. An elastic interface design allows an external receiver communicating with a similar elastic interface transmitter to deskew (line up) the data bits within each clock-data group to account for path variance across the bus, to align separate clock-data groups after they have been deskewed to compensate for noise, to adjust for non-ideal duty cycles and voltage reference (VRef) distortion, and to make dynamic recalibrations to keep the bus aligned and sampling correctly during variations of voltage and temperature.

The verification environment 102 may be a software environment to assist designers and testers with the functional verification process by automating testbenches, running simulations, and the like. The verification environment 102 may generate design stimuli, provide stimuli to the DUT 104, and then monitor and check the responses to the stimuli. Verification environment 102 may include any simulators or tests that are used in the functional verification process. The simulators and/or tests may be distributed over multiple servers or computers. Simulations (including tests or the results of simulators) may test for failures (also known as bugs or faults) in the design, which are situations where the logic expressed in the design language (e.g., VHDL, Verilog) does not perform correctly under specific situations. Many tests must typically be performed to properly verify a design. The verification environment 102 may include one or more verification tools 110 to assist in the functional verification process and to assist in handling the large amount of tests. Verification tools may include in-house or existing verification automation tools such as Verisity's Specman® testbench automation software, which provides an environment for generation of functional tests, data and temporal checking, functional coverage analysis, and HDL simulation control. Verification tools 110 may include any other type of testbench automation software, including code written in C++ or other languages. Verification tools 110 may also be packaged in modules known as verification IP to facilitate collaboration or use of third party tools.

The verification environment 102 may also include a relative positioning module 112 in communication with one or more verification tools 110. The relative positioning module 112, which is described in more detail in relation to FIG. 2, may provide for translating between relative positions and specific locations of a structure such as an I/O bus design. The relative positioning module 112 may translate between relative positions and specific locations upon request by a verification tool 110. In some embodiments, the relative positioning module 112 may take a list representing specific bit locations and return a relative position in the form of a single user-defined type. This relative position may represent a single bit or a group of bits and the user-defined type could include generalized positions such as the first bit, the last bit, the middle bit, all of the bits, or other generalized descriptions. This specific location to relative position conversion may be useful for functional coverage analyses. For example, a list of specific bit locations affected by a test could be passed to the relative positioning module 112 which may itself translate those specific bit locations and provide a relative position describing the provided bits, such as by providing information that the list of specific bits included both the first bit of the tested bus design and the last bit of the bus design. A user or verification tool 110 may then assign the returned position to a coverage item within a coverage group and cross it with other items to assist in determining coverage.

Using the specific location to generalized position conversion, a user or software module in this example need not know the size of a bus or the bit locations of the hierarchical boundaries that comprise the bus. Without a relative positioning module 112, a user would need to use coverage ranges alone to either restrict testing to a specific bus size and configuration or write many configuration files to pre-define the bus configuration using "#define" constants that could be used in the coverage item ranges. The relative positioning module 112 may thus return a more generalized position in a user-defined range (i.e., first, middle, last, all, etc.) when passed a specific location. For coverage purposes, a user may advantageously set general range criteria and then run the criteria against any size/configuration bus with any type of grouping definition and, from the results, determine whether important boundaries are being hit.

Similarly, the relative positioning module 112 may also translate from a relative position to a specific location in other embodiments, which may prove useful for test generation or other purposes. In these embodiments, the relative positioning module 112 may receive a relative position from a user or module, translate the relative position, and provide specific locations as a result. For example, a user may desire for a testcase to hit the first bits on a bus and the last bits on a bus. By submitting an indication of the first and last positions to the relative positioning module 112, the user may receive from the relative positioning module 112 the specific bit locations associated with the first and last positions. The user may then create a testcase so that a bus functional module (BFM) of the verification tools 110 may then send data to the DUT 104 or, alternatively, the verification environment 102 may communicate the information directly to the BFM independent of the user. This embodiment may be particularly useful when a user needs to pare down a fully randomized situation to a more specific type of test but still hit the desired boundaries and ranges.

The translation by the relative positioning module 112 between relative positions and specific locations may be performed at any level of simulation. In some embodiments, the relative positioning module 112 may translate at a bus level within a unit simulation, with the user-defined types referring to bits within a bus (e.g., first bit in the bus, etc.). The relative positioning module 112 may also, in other embodiments, refer to a system view, such as chips within a system (e.g., multiple processors in a system, multiple memory chips in a master-slave chain, etc.). The flexibility in level of simulation may apply to both directions of translation by the relative position module 112, providing a flexible mechanism of adapting to varying chips, bus designs, or other structures.

By providing for translation between user-defined relative positions and specific locations in a design, the disclosed system may provide an effective and efficient mechanism for analyzing relative positioning in a structure such as an IC design. The disclosed system advantageously eliminates the necessity to use coverage item ranges in conjunction with many configuration files and '#define' constants. In as little as a single line of code, a user may create an item for a coverage group that represents the relative position(s) of an item(s) (bits or chips) that have been affected by any given factor, which may then be crossed with other items in the same coverage group. When a coverage report is generated, the user need not know, for example, which bit was the last bit on the bus to determine if that particular bit was affected as there will be a user-defined indication representing the last bit. This system may be used in the verification of any system and may be particularly useful for structures with logical groupings and may also be extended to assist in the coverage of parameterizable and scalable multi-instance designs (cases where the same design entity is configured to be replicated multiple times in a system). A user performing coverage tasks may also benefit by the disclosed system facilitating the creating of focused testcases by providing specific bit (or chip) locations for boundaries or other relative positions. The disclosed system accordingly provides for dynamic ranging for different I/O bus or IC designs.

Figure 2:
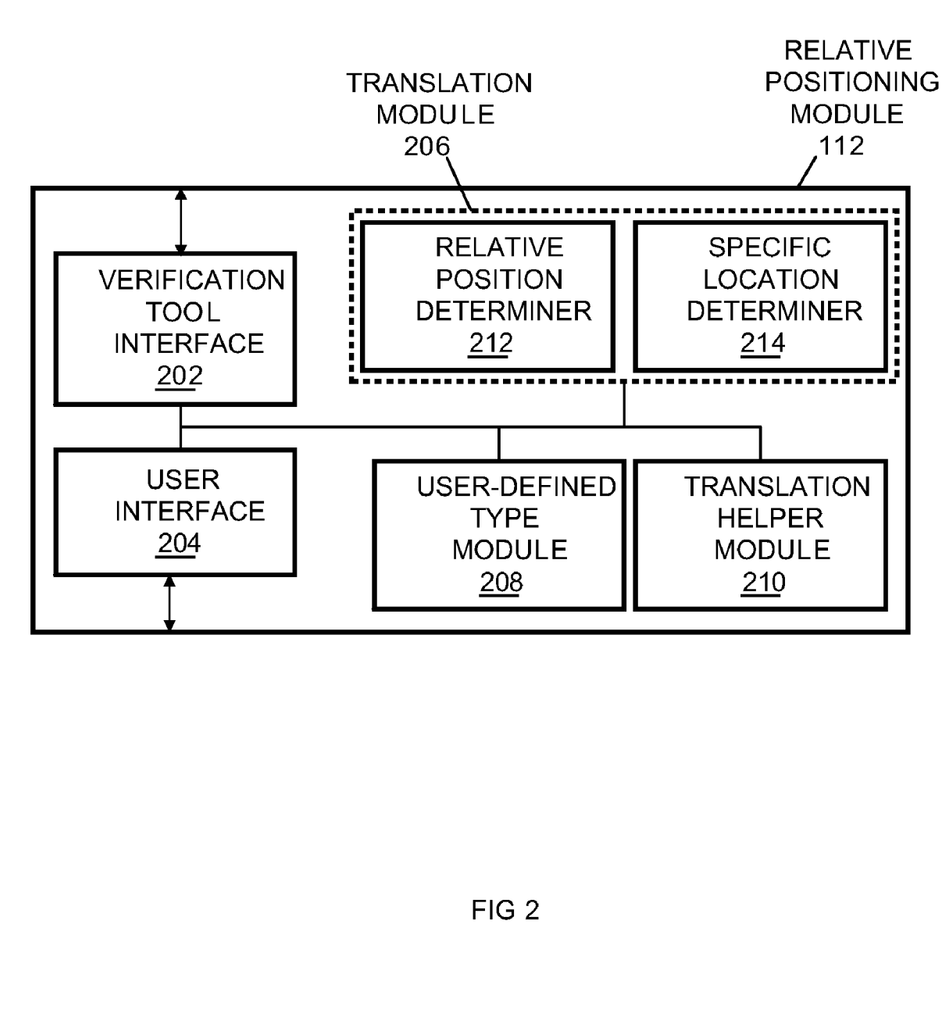
FIG. 2 depicts a schematic view of components of the relative positioning module of the verification environment according to some embodiments.

FIG. 2 depicts a schematic view of components of the relative positioning module of the verification environment according to some embodiments. The relative positioning module 112 of the disclosed embodiment includes a verification tool interface 202, a user interface 204, a translation module 206, a user-defined type module 208, and a translation helper module 210. The verification tool interface 202 may receive requests for translation of specific locations or relative positions from a verification tool 110 and may also transmit the results of the translation back to the requesting verification tool 110. Similarly, the user interface 204 may facilitate communications to and from a user on a user computer system 108, including requests for translations and results or user preferences. The user interface module 204 may also, in conjunction with the user-defined type module 208, receive requests for new or modified user-defined types from a user.

Figure 3:
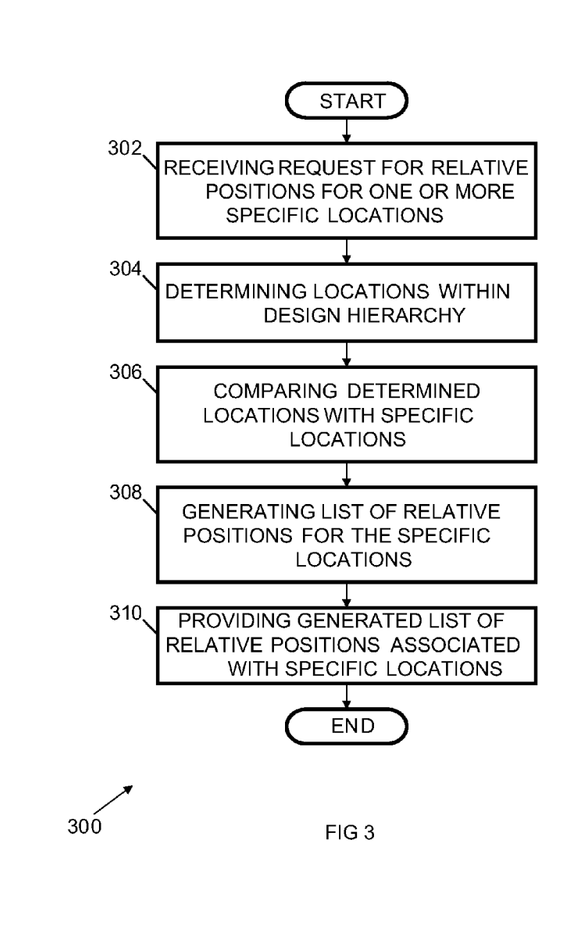
FIG. 3 depicts an example of a flow chart for translating specific locations of a design to relative positions of the design according to one embodiment.
Figure 4:
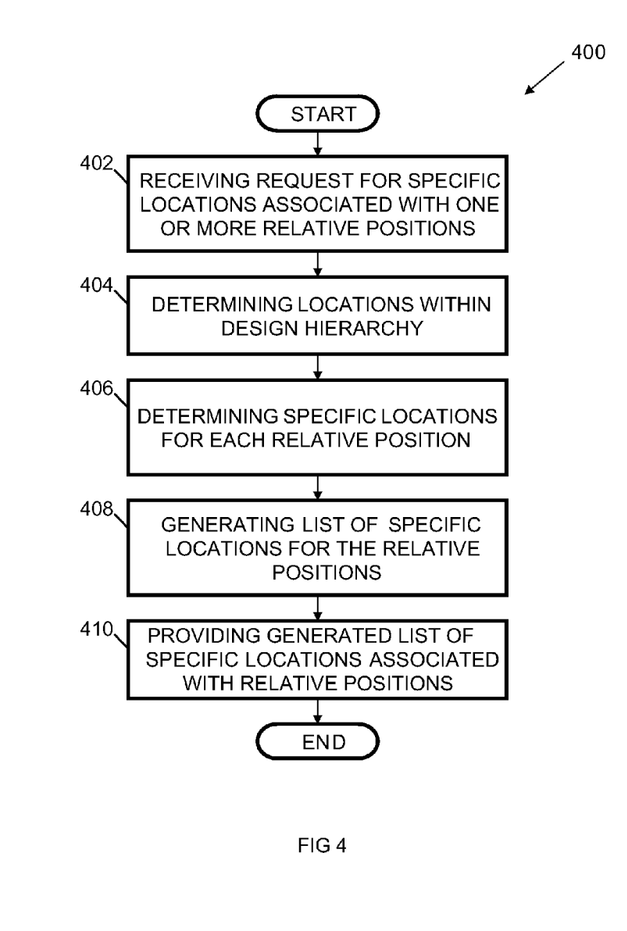
FIG. 4 depicts an example of a flow chart for translating relative positions of a design to specific locations of the design according to one embodiment.
Figure 5:
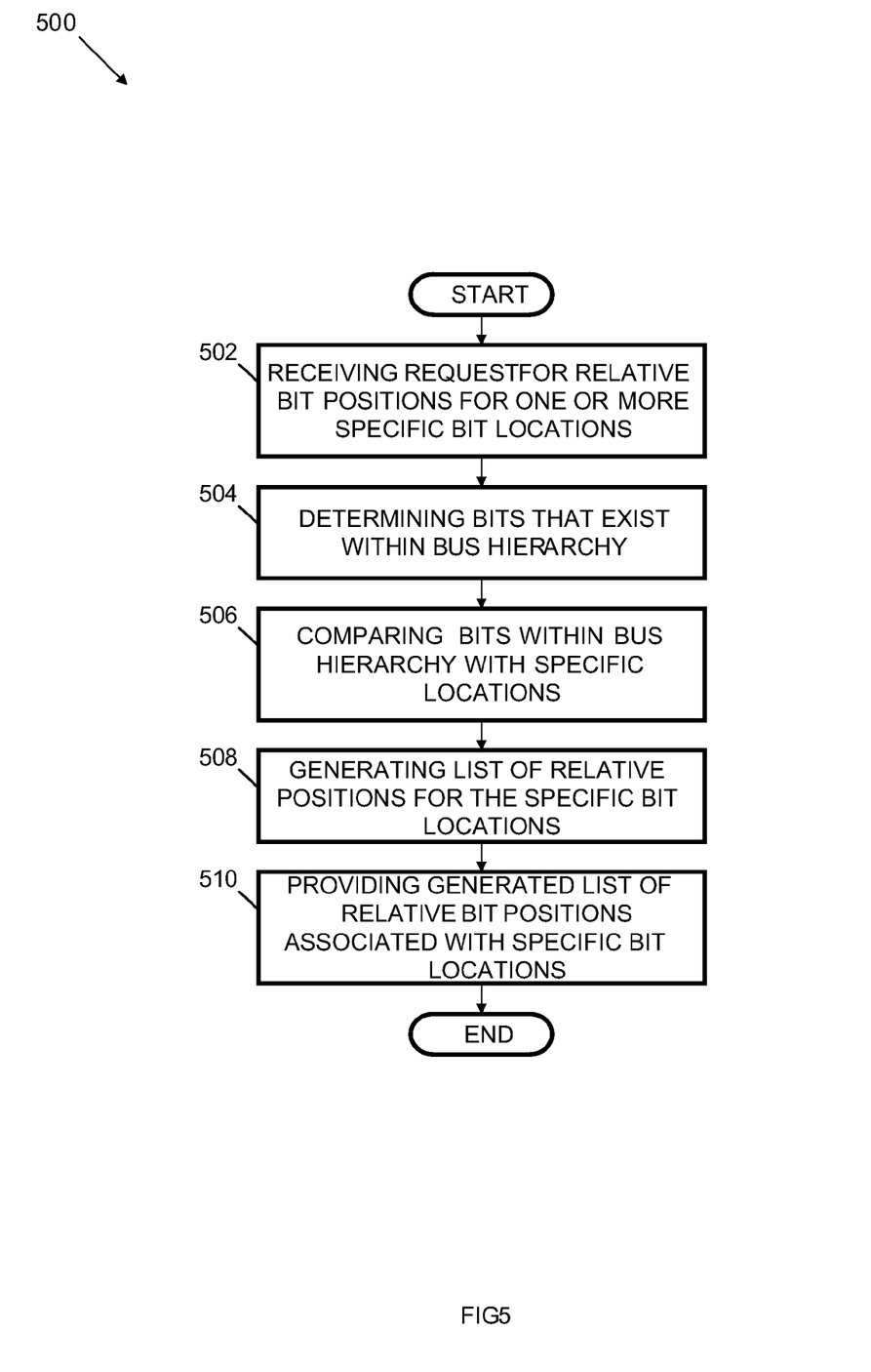
FIG. 5 depicts an example of the flow chart of FIG. 3 for translating specific bit locations to relative bit positions according to one embodiment.

The translation module 206 may translate between relative positions and specific locations in a design, as described in more detail in relation to FIGS. 3-5. The translation module 206 may perform its tasks in conjunction with the user-defined type module 208 and the translation helper module 210. The translation module 206 may include one or more optional sub-modules such as a relative position determiner 212 and a specific location determiner 214 to also assist in performing its tasks. In some embodiments, the translation module 206 may translate between relative positions and specific locations in both directions, while in other embodiments the translation module 206 may only translate in one direction, such as when it may only translate from specific locations to relative positions.

The relative position determiner 212 of the translation module 206 may determine a relative position based on received specific locations, a design hierarchy, and/or the user-defined types representing the relative positions, as described in more detail in relation to FIGS. 3 and 5. The design hierarchy may represent the particular hierarchy of elements or components of a structure. The relative position determiner 212 may call the translation helper module 210 and receive back information about the bus or other structure (i.e., the design hierarchy) from the translation helper module 210. The relative position determiner 212 may then determine the relative positions associated with the specific locations by using the information received from the translation helper module 210 and information about user-defined types accessed in the user-defined type module 208. To accomplish this, the relative position determiner 212 may compare the locations received from the translation helper module 210 (the locations of bits, etc., associated with boundaries for the bus or IC system design) with the received specific locations to generate a list of relative positions for the received specific locations. The relative position determiner 212 may then provide the generated list of relative positions associated with the received specific locations to a user or calling software application. Accordingly, the relative position determiner 212 may translate one or more specific locations into the relative positions for a particular design and provide that to the requesting user or application, which advantageously need not know the details of the design.

The specific location determiner 214 of the translation module 206 may determine specific locations based on received relative positions, a design hierarchy, and/or the user-defined types representing the relative positions, as described in more detail in relation to FIG. 4. The specific location determiner 214 may call the translation helper module 210 and receive back information about the bus or IC design from the translation helper module 210. The specific location determiner 214 may then determine the specific locations associated with the relative positions by using the information received from the translation helper module 210 and information about user-defined types accessed in the user-defined type module 208. To accomplish this, the specific location determiner 214 may determine a specific location or locations for each received relative position to generate a list of specific locations. The specific location determiner 214 may then provide the generated list of specific locations associated with the received relative positions to a user or calling software application. Accordingly, the specific location determiner 214 may translate one or more relative positions to one or more associated specific locations for a particular design and provide that to the requesting user or application, which advantageously need not know the details of the design.

The user-defined type module 208 may manage the user-defined types for the relative positioning module 112. The user-defined type module 208 may, for example, provide an indication of existing user-defined types to a component of the translation module 206. In another example, the user-defined type module 208 may interact with a user on a user computer system 108 to generate more user-defined types. User-defined types may include any types related to a relative position, such as FIRST, LAST, MIDDLE, NEXT_TO_LAST, etc., or groups of positions, such as MULTIPLE, ALL, etc. This allows a type to represent either the location of a single entity or the locations of multiple entities. If a location does not match any user-defined type, a user-defined type of INVALID may be used. The type definition may also be extended to include other values as appropriate for a verification environment 102, such as THIRD (or other position), EVEN, ODD, or any other indication of relative position. User-defined types may represent a relative position in a design. In one example, a user-defined type may represent a bit position in a bus design. In some embodiments, the user-defined type may be independent of any hierarchy with regards to position. The FIRST user-defined type may represent, for example, the first bit of a bus, a first group of a bus, a first pack within a group, a first chip in an N-way system, or a first slave in a master/slave chain. The hierarchy may be determined by the method arguments when the translation module 206 (and thus the user-defined type module 208) is called. Through the use of a flexible hierarchy structure, the translation module 206 may advantageously be used with designs at different levels of hierarchy, including from the bit level to a multi-chip system level.

The translation helper module 210 may take hierarchy information (e.g., a group number, a pack number, and/or a bit number) as arguments and return a list containing information about the arguments provided. The translation helper module 210 may be called by either the relative position determiner 212 or the specific location determiner 214. The translation helper module 210 may thus receive information associated with a hierarchy and return location information associated with the hierarchy when called by either the relative position determiner 212 or the specific location determiner 214. The return list may include, for example, group, pack, and bit id's with respect to the bus, pack and bit id's with respect to the enclosing group, a bit id with respect to the enclosing pack, as well as the number of bits in the pack and group. Any values that do not apply (e.g., bit values when only a group value was provided as an argument) may return a '−1' or other null argument. In this fashion the translation helper module 210 may facilitate different levels of hierarchy. The translation helper module 210 may thus obtain information about the hierarchy of a design when called by the relative position determiner 212, such as by providing the number of bits in a pack and the first bit of the pack when the PACK hierarchy is specified.

FIG. 3 depicts an example of a flow chart for translating specific locations of a design to relative positions of the design according to one embodiment. The method of FIG. 3 may be useful for, for example, a user desiring to determine the relative positions (e.g., bit positions) for a group of specific locations (e.g., bit locations) for the purposes of determining functional coverage. The elements of flow chart 300 may be performed, in one embodiment, by components of the relative positioning module 112 of the verification environment 102. Flow chart 300 begins with element 302, receiving a request for relative positions for one or more specific locations of entities within an IC design. Element 302 may be, for example, the result of a method call by a verification tool 110 within the verification environment 102 or a request by a user for relative positions. The request may include a list of bits (which may be unsigned integers) and a hierarchy, such as a type representing the level of hierarchy. Example hierarchies of a design include, but are not limited to, SYSTEM, CHIP, BUS, GROUP, and PACK. In some embodiments, the request may also include group or pack numbers which are only utilized if the hierarchy is GROUP or PACK.

After receiving a request, the method of flow chart 300 may continue to element 304, determining locations within a design hierarchy. In one embodiment, a translation helper module 210 may perform element 304 upon request or call by the relative position determiner 212 of the translation module 206. In this embodiment, the translation helper module 210 may take hierarchy information (i.e., a group number, a pack number, and/or a bit number) as arguments and return a list containing information about the arguments provided (i.e., information about the structure of the design hierarchy). The return list may include, for example, group, pack, and bit id's with respect to the bus, pack and bit id's with respect to the enclosing group, a bit id with respect to the enclosing pack, as well as the number of bits in the pack and group. Any values that do not apply may return a '−1' or other null argument.

The relative position determiner 212 may then, at element 306, compare the determined locations with the specific locations received at element 302. At element 306, the relative position determiner 212 may compare the known bit numbers within the appropriate hierarchy (as determined at element 304) to the list of bits passed as an argument and received at element 302. The translation module 206 may then generate a list of relative positions for the specific location at element 308 based on the position or positions which matched at the comparison of element 306. At element 310, the translation module 206 may provide the generated list of relative positions associated with specific locations to the requesting software (by the method returning a value), to a user (via display or print-out or other output), as part of a coverage report, or in any other fashion, after which the method of flow chart 300 terminates.

FIG. 4 depicts an example of a flow chart for translating relative positions of a design to specific locations of the design according to one embodiment. The method of FIG. 4 may be useful for, for example, a user desiring to determine specific locations for boundaries or other relative positions for the purposes of test generation. The elements of flow chart 400 may be performed, in one embodiment, by components of the relative positioning module 112 of the verification environment 102. Flow chart 400 begins with element 402, receiving a request for specific locations associated with one or more relative positions. Element 402 may be, for example, the result of a method call by a verification tool 110 within the verification environment 102 or a request by a user for specific locations. The request may include a list of user-defined ranges (e.g., first bits on a bus, all bits in a group, etc.) and a hierarchy, such as a type representing the level of hierarchy.

After receiving a request, the method of flow chart 400 may continue to element 404, determining locations within a design hierarchy. In one embodiment, a translation helper module 210 may perform element 404 upon request or call by the specific location determiner 214 of the translation module 206. In this embodiment, the translation helper module 210 may take hierarchy information (i.e., a group number, a pack number, and/or a bit number) as arguments and return a list containing information about the arguments provided. The return list may include, for example, group, pack, and bit id's with respect to the bus, pack and bit id's with respect to the enclosing group, a bit id with respect to the enclosing pack, as well as the number of bits in the pack and group. Any values that do not apply (e.g., bit values when only a group value was provided as an argument) may return a '−1' or other null argument.

The specific location determiner 214 may then, at element 406, determine the specific locations for each relative position within the request received at element 402. At element 406, the specific location determiner 214 may utilize the determined locations within the design hierarchy and compare them to the received relative positions. The comparison of the determined locations within the design hierarchy and the received relative positions will provide the specific locations in the design for each received relative position. For example, if the determined location indicated that 'bit 7' was the last bit on the bus and the received relative position was 'LAST BIT' for a BUS hierarchy, the determined specific location for the LAST BIT would be 'bit 7'. The specific location determiner 214 may then generate a list of specific locations for each relative position at element 408 and the translation module 206 may provide the generated list of specific locations associated with the received relative positions at element 410, after which flow chart 400 terminates.

FIG. 5 depicts an example of the flow chart of FIG. 3 for translating specific bit locations to relative bit positions according to one embodiment. The method of FIG. 5 is based on that of FIG. 3 and the description of FIG. 3 will not be repeated in the interest of brevity. The method of FIG. 5 may represent a specific example of the method of FIG. 3 as applied to bits at the pack hierarchy of an I/O bus and may be useful for tasks such as determining functional coverage. The elements of flow chart 500 may be performed, in one embodiment, by components of the relative positioning module 112 of the verification environment 102. Flow chart 500 begins with element 502, receiving a request for relative bit positions for one or more specific bit locations. Element 502 may be, for example, the result of a method call or declaration by a verification tool 110 within the verification environment 102 or a request by a user for relative positions. An example method declaration may be:

```
get_bit_pos(bits : list of uint, hierarchy : hierarchy_type, group :
uint, pack : uint) : bit_pos_type is { }
``` which takes as arguments a list of bits (as unsigned integers), an indication of a hierarchy (a user-defined type), and group and pack numbers (which are conditionally set based on the hierarchy selected) and returns a relative bit position as a user-defined type.

After receiving a request, the method of flow chart 500 may continue to element 504, determining bits that exist within the bus hierarchy. The relative position determiner 212 may call the translation helper module 210 to perform element 504. An example method declaration may be:

get_bit_info(group: int, pack: int, bit: int): list of int is { } which passes hierarchy information (group, pack, and bit numbers) and returns a list containing information about the arguments provided, such as a group, pack, and bit id's with respect to the bus; pack and bit id's with respect to the enclosing group; a bit id with respect to the enclosing pack, as well as the number of bits in the pack and group. Any values that do not apply may return a '−1' or other null argument.

The relative position determiner 212 may then, at element 506, compare the determined relative locations (from element 504) with the specific locations received at element 502. At element 506, the relative position determiner 212 may compare the known id's within the appropriate hierarchy (as determined at element 504) to the list of id's passed as an argument and received at element 502. The translation module 206 may then generate a list of relative positions for the specific location at element 508 based on the position or positions which matched at the comparison of element 506. At element 510, the translation module 206 may provide the generated list of relative positions associated with specific locations to the requesting software (by the method returning a value), after which the method of flow chart 500 terminates.

The method of flow chart 500 may be used, for example, to cover error bits at the pack hierarchy (denoted by the term PACK as the hierarchy specifier in the second argument), as demonstrated in the example code snippet:

```
item error_present : bool; -- indicates error has occurred
item error_bits : bit_pos_type = get_bit_pos(<list of error bit
numbers>, PACK,
    group_id, pack_id); -- gets relative bit positions in pack
    with errors
cross error_present, error_bits; -- cross of two items
```

The example code snippet above defines a coverage group of error bits and includes a method call to 'get_bit_pos.' A list of specific error bits, the hierarchy specifier (PACK, in this instance), and the group and pack numbers for this cover statement are passed to the 'get_bit_pos' method as arguments. The 'get_bit_pos" method returns a user-defined relative position type which is then crossed with a boolean value indicating whether errors were present or not. One skilled in the art will recognize that other coding styles and languages may also be used.

Each software program described herein may be operated on any type of computer, such as personal computer, server, etc. Any programs may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described herein may be identified based upon the application for which they are implemented in a specific embodiment of the invention. However, it should be appreciated that any particular program nomenclature used herein is used merely for convenience, and thus the invention should not be limited to use solely in any specific application identified and/or implied by such nomenclature.

It will be apparent to those skilled in the art having the benefit of this disclosure that the present invention contemplates methods, systems, and media for using relative positioning in structures with dynamic ranges. It is understood that the form of the invention shown and described in the detailed description and the drawings are to be taken merely as examples. It is intended that the following claims be interpreted broadly to embrace all the variations of the example embodiments disclosed.

What is claimed is:

1. A system for using relative positioning within an Integrated Circuit (IC) design structure, the system comprising:
   an interface to receive requests to determine relative positions for one or more specific locations of entities within an IC design structure, the requests comprising a list of bits and hierarchy information for each bit, and to receive requests to determine specific locations associated with one or more relative positions of an IC design structure, the requests comprising a list of user-defined ranges and hierarchy information for each user-defined range;
   a user-defined type module, the user-defined type module comprising one or more user-defined types representing a relative position in a structure;
   a translation helper module, the translation helper module being adapted to receive information associated with a hierarchy and to return location information associated with the hierarchy;

a translation module in communication with the user-defined type module and the translation helper module, the translation module being adapted to translate between a specific location and relative position of the structure based on one or more user-defined types and location information returned from the translation helper module and to generate a list of translated results;

a relative position determiner of the translation module, the relative position determiner translating one or more received specific locations to one or more relative positions by determining locations within a design hierarchy based on the request to determine relative positions by determining design hierarchy locations with respect to an enclosing group within the hierarchy for each of the bits, comparing the determined locations with the one or more specific locations of the request by comparing known bit numbers within the design hierarchy to the bits of the request, and generating a list of relative positions based on bits of the request that matched known bit numbers within the determined design hierarchy; and a specific location determiner of the translation module to translate one or more received relative positions to one or more specific locations by determining locations within a design hierarchy based on the request to determine specific locations by determining design hierarchy locations with respect to an enclosing group within the hierarchy for elements of each of the user-defined ranges, determining specific locations for each relative position in the request to determine specific locations, and generating a list of the determined specific locations for each relative position.

2. The system of claim 1, wherein the interface is a user interface to receive input from a user and to provide output to a user.

3. The system of claim 1, wherein the interface is a verification tool interface to communicate with one or more verification tools in a verification environment.

4. The system of claim 1, wherein the translated results comprise one or more of a bit location, a pack location, a group location, a bus location, a node location, and a chip location.

5. The system of claim 1, wherein the translated results comprise one or more of a relative bit position, a relative pack position, a relative group position, a relative bus position, a relative node position, and a relative chip position.

* * * * *